United States Patent
Wu et al.

(10) Patent No.: US 7,106,102 B2
(45) Date of Patent: Sep. 12, 2006

(54) PROGRAMMABLE LEVEL SHIFTER FOR WIDE RANGE OPERATION PURPOSE

(75) Inventors: Chih-Hung Wu, Kaohsiung (TW); Meng-Jer Wey, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 92 days.

(21) Appl. No.: 10/913,803

(22) Filed: Aug. 6, 2004

(65) Prior Publication Data

US 2006/0028244 A1    Feb. 9, 2006

(51) Int. Cl.
*H03K 19/0175* (2006.01)
(52) U.S. Cl. .............................. 326/81; 326/68; 326/62
(58) Field of Classification Search .................. 326/63, 326/68, 81
See application file for complete search history.

(56) References Cited

U.S. PATENT DOCUMENTS 4,532,436 A * 7/1985 Bismarck ..................... 327/208
6,888,394 B1 * 5/2005 Cleary et al. ................ 327/333

* cited by examiner

*Primary Examiner*—Vibol Tan
(74) *Attorney, Agent, or Firm*—Winston Hsu

(57) ABSTRACT

A programmable level shifter. The programmable level shifter comprises a first P-type FET, a first N-type FET, a second P-type FET, a second N-type FET, and a programmable device. The first P-type FET is coupled between a fist power line and a non-inverted output node, and a gate pole thereof is coupled to a inverted output node. The first N-type FET is coupled between the first P-type FET and a second power line. The programmable device is coupled between the first power line and the non-inverted output node, which can be programmed to change an effective resistance between the first power line and the inverted output node when the second P-type FET is turned on.

7 Claims, 4 Drawing Sheets

PROGRAMMABLE LEVEL SHIFTER FOR WIDE RANGE OPERATION PURPOSE

BACKGROUND

The invention relates to a level shifter, and more particularly to a programmable level shifter.

In many logic, memory and timing arrangements, communication between functional blocks requires different driving voltages. Voltage level shifters provide an interface for output of voltage levels from one block that does not meet the voltage level requirements of an interconnected block.

FIG. 1 shows a circuit diagram of a conventional level shifter. Normally, the level shifter 1 transforms a low input voltage level Vin to a high voltage level swinging between a ground Vg and a high power supply voltage Vs. When the input voltage level Vin is at a low logic of approximately zero volts, for example, an N-type field effect transistor (FET) MN2 is turned off and an N-type FET MN1 is turned on. While the N-type FET MN1 is completely turned on, a first output Vo1 is to be pulled down substantially to the ground Vg. In contrast to the previous example, when the input voltage level Vin is at a high logic, the first output Vo1 is to be pulled up substantially to the high power supply voltage Vs while the N-type FET MN2 is completely turned on.

With respect to achieving a desired electrical performance or functional ability, commonly, the level shifter 1 has a predetermined ratio of a pull-up device and a pull-down device. The level shifter 1, however, may malfunction when either the input voltage level Vin or the high power supply voltage Vcc1 thereto is altered. For example, when the level shifter 1 is designed to transform a 1.8-volt voltage level to a 2.5-volt voltage level, if the level shifter 1 is disposed in a 3.3-volt IO circuit to provide a specific circuit with 3.3-volt voltage level, the output Vo thereof may not be pulled up or be pulled down substantially, thus a malfunction occurs and performance such as balanced delay time thereof would be affected. Hence, the conventional level shifter 1 is only capable of driving the specific circuit with a specific operational voltage level, affecting compatibility.

SUMMARY

An aspect of the invention provides a programmable level shifter, which comprises a first P-type field effect transistor (FET), a first N-type FET, a second P-type FET, a second N-type FET, and a programmable device.

The first P-type FET is coupled between a first power line and a non-inverted output node and has a gate electrode coupled to an inverted output node. The first N-type FET is coupled between the non-inverted output node and a second power line and has a gate electrode serving as an inverted input node. The second P-type FET is coupled between the first power line and the inverted output node and has a gate electrode coupled to the non-inverted output node. The second N-type FET is coupled between the inverted output node and the second power line and has a gate electrode as a non-inverted input node. The programmable device is coupled between the first power line and the non-inverted output node and comprises at least a third P-type FET. The programmable device can be programmed to determine whether the third P-type FET is connected in parallel with the first P-type FET to change the effective resistance between the first power line and the non-inverted output node when the first P-type FET is turned on.

Thus, the effective resistance between the first power line and the non-output node can be changed after the programmable device is programmed, i.e., a pull-up device of the programmable level shifter has two effective states, thus, improving compatibility.

BRIEF DESCRIPTION OF THE DRAWINGS

An embodiment of the invention will become more fully understood by referring to the following detailed description and accompanying drawings, wherein.

DETAILED DESCRIPTION

Figure 1:
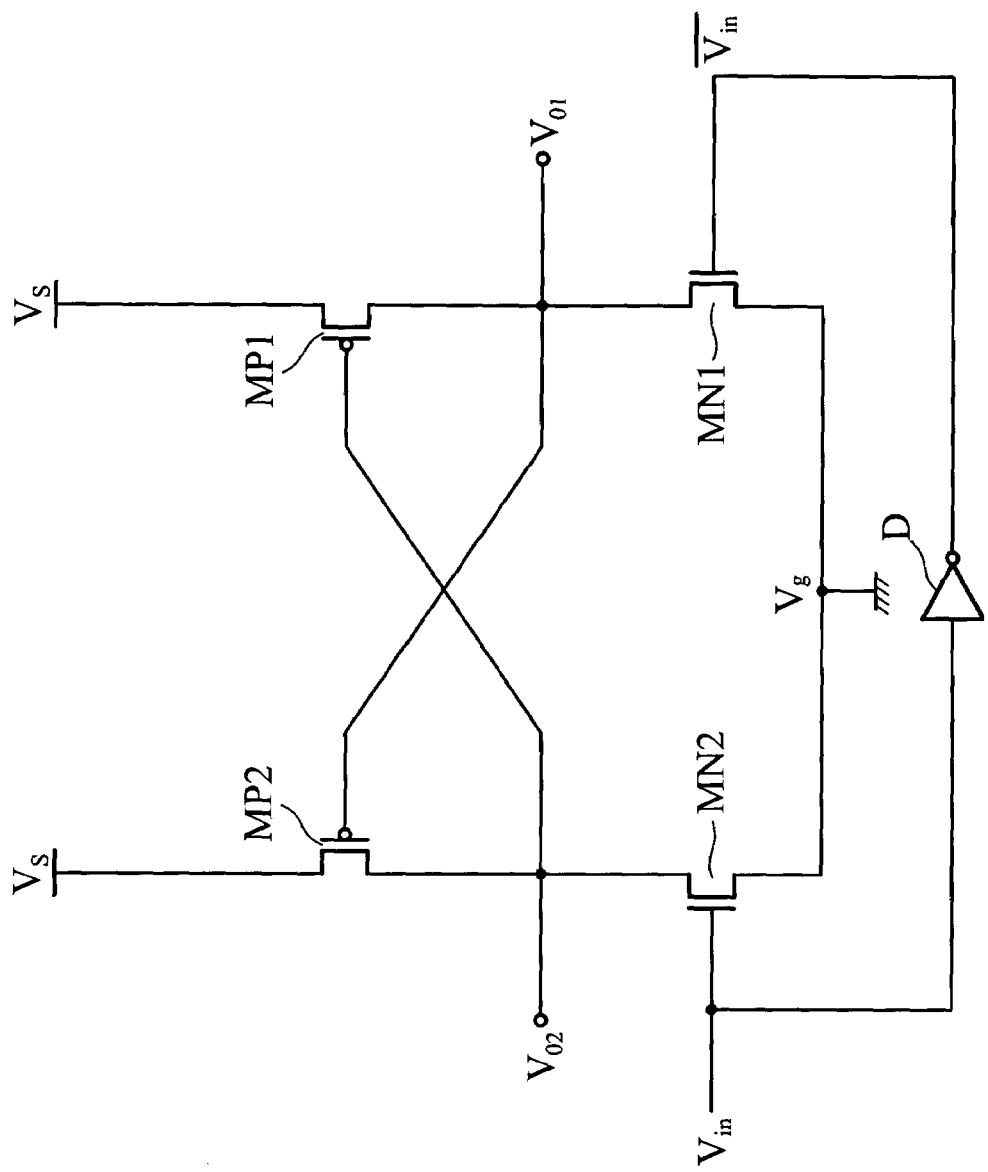
FIG. 1 shows a circuit diagram of a conventional level shifter.
Figure 2:
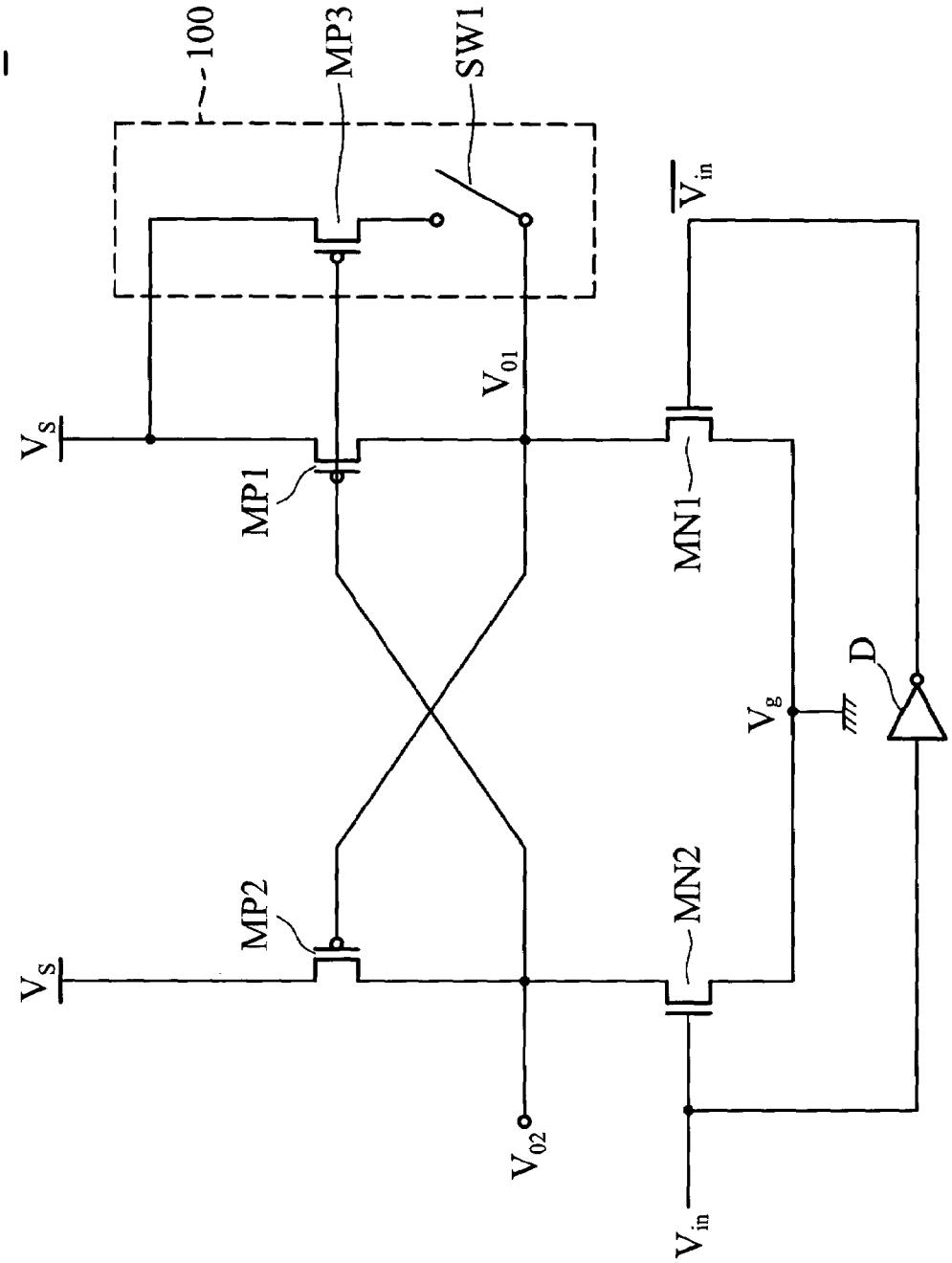
FIG. 2 shows a circuit diagram of a programmable level shifter of the invention.

FIG. 2 shows a circuit of a level shifter of an embodiment of the invention. The programmable level shifter 2 comprises a P-type FET MP1, an N-type FET MN1, a P-type FET MP2, an N-type FET MN2, and a programmable device 100. The P-type FET MP1 is coupled between a power line Vs and a non-inverted output node Vo1 and has a gate electrode coupled to an inverted output node Vo2. The N-type FET MN1 is coupled between the non-inverted output node Vo1 and a ground Vg, and has a gate electrode as an inverted input node $\overline{V_{in}}$. The P-type FET MP2 is coupled between the power line Vs and the inverted output node Vo2 and has a gate electrode coupled to the non-inverted output node Vo1. The N-type FET MN2 is coupled between the inverted output node Vo2 and the ground Vg and has a gate electrode as a non-inverted input node Vin. The programmable device 100 is coupled between the power line Vs and the non-inverted output node Vo1, and comprises at least a P-type FET MP3. The programmable device 100 can be programmed to determine whether the P-type FET MP3 is connected in parallel with the P-type FET MP1 to change an effective resistance between the power line Vs and the non-inverted output node Vo1 when the P-type FET MP1 is turned on.

The N-type FET, for example, is a NMOS, and the P-type FET, for example, is a PMOS. Additionally, an inverting means such as an inverter D is coupled between the non-inverted input node Vin and the inverted input node $\overline{V_{in}}$, thus a signal of the inverted input node $\overline{V_{in}}$ is complementary to a signal of the non-inverted input node Vin.

Figure 3:
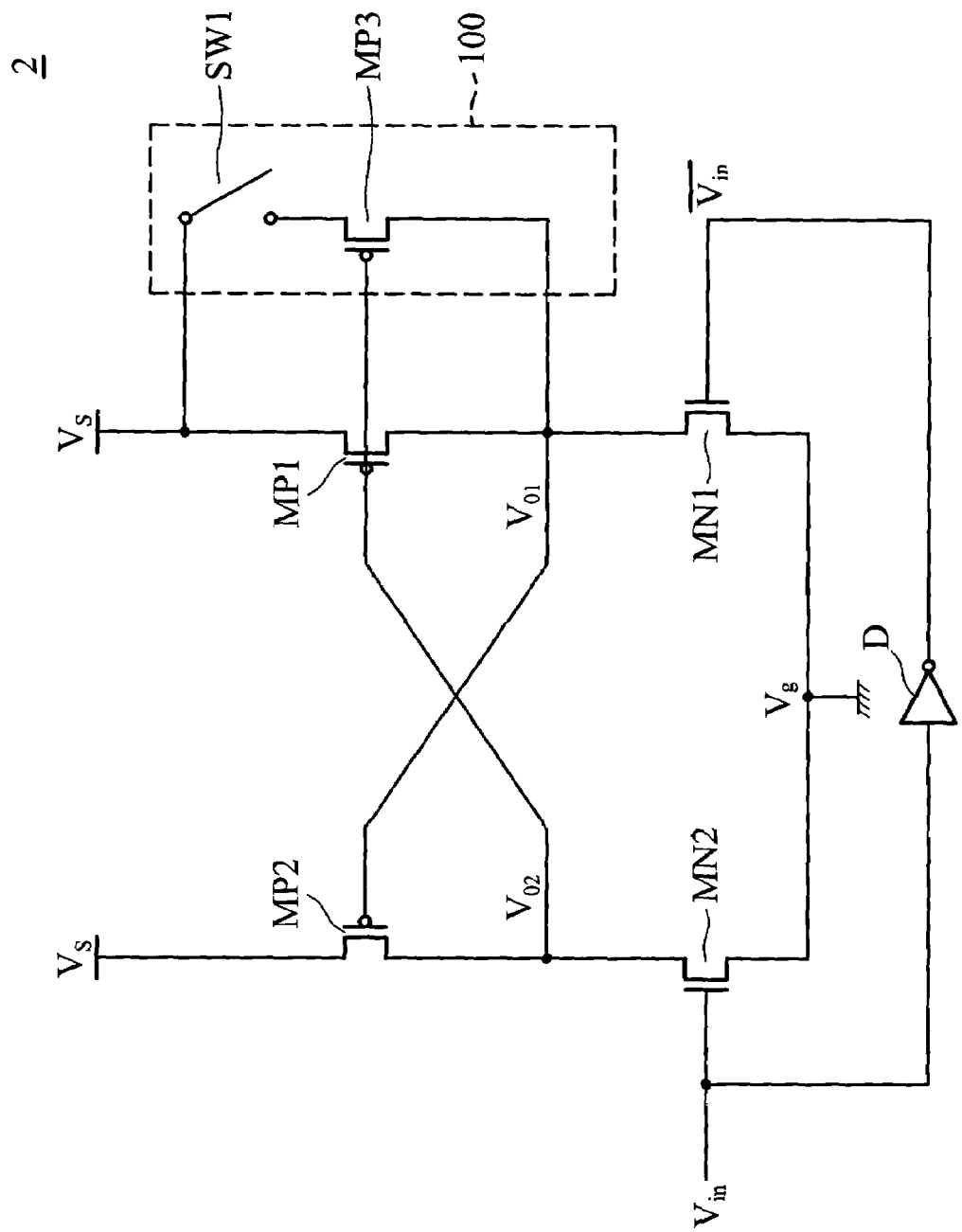
FIG. 3 shows a circuit diagram of a programmable level shifter of the invention.

The programmable device 100 further comprises a switch SW1 such as a programmable fuse. The switch SW1 is connected in series with the P-type FET MP3. For example, the switch SW1 can be coupled between the P-type FET MP3 and the non-inverted output node Vo1 as shown in FIG. 2, or coupled between the power line Vs and the P-type FET MP3 as shown in FIG. 3.

Figure 4:
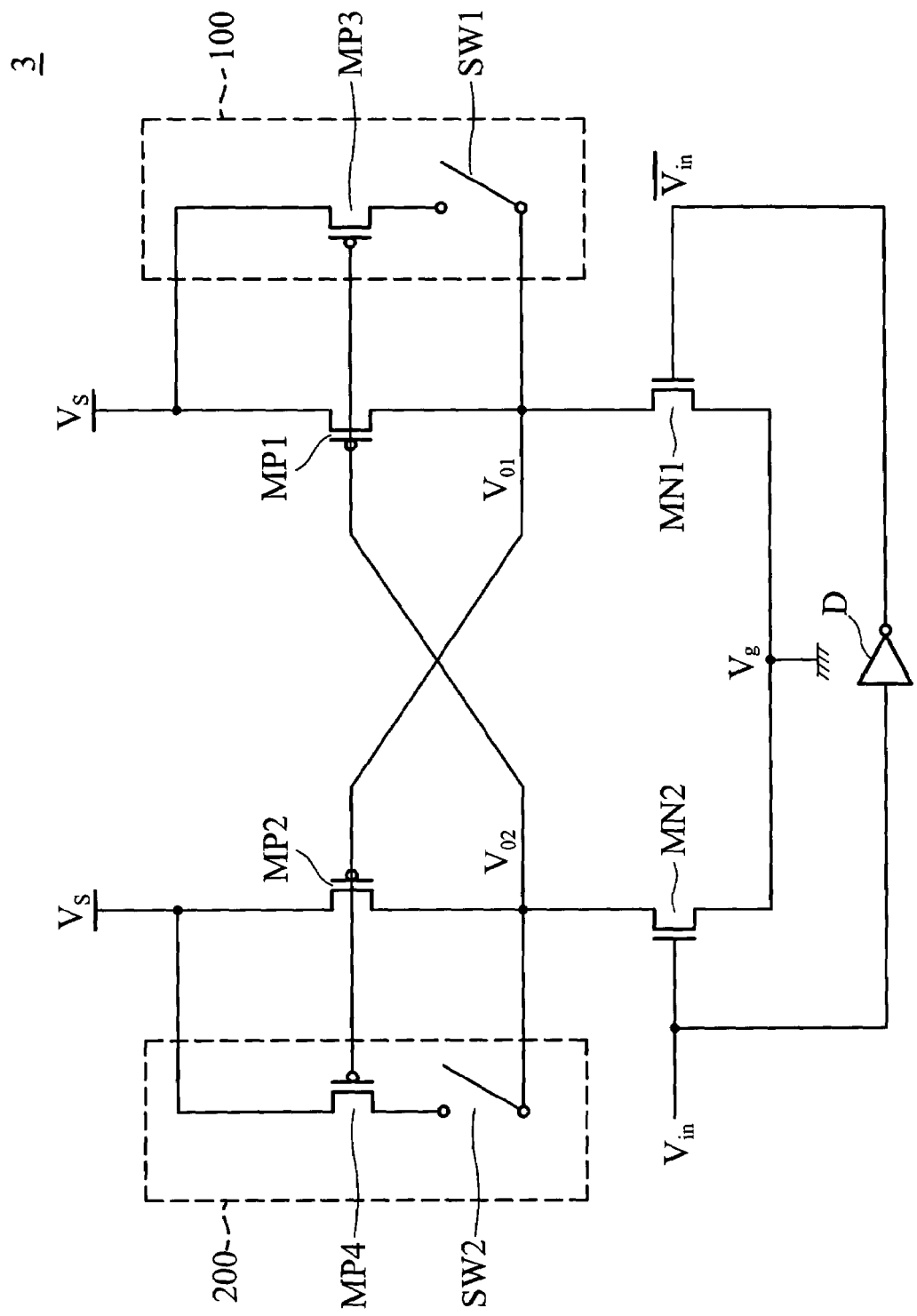
FIG. 4 shows a circuit diagram of a programmable level shifter of the invention.

In FIG. 4, a programmable level shifter 3 further comprises a programmable device 200 between the power line Vs and the inverted output node Vo2, which is capable of being programmed to change an effective resistance between the power line Vs and the inverted output node Vo2 when the P-type FET MP2 is turned on. The programmable device 200 comprises a P-type FET MP4, and a switch SW2 thereof is coupled in series with the P-type FET MP4. For example, the switch SW2 such as a programmable fuse is coupled between the P-type FET MP4 and the inverted output node Vo2 as shown in FIG. 4. Thus, when the programmable device 200 is programmed, the switch SW2 is enabled, whereby the P-type FET MP4 is coupled in parallel with the P-type FET MP2 to change an effective resistance between the power line Vs and the inverted output node Vo2.

Suppose that the effective resistance between the power line Vs and the non-inverted output node Vo1 is first pull-up resistance, and the effective resistance between the power line Vs and the inverted output node Vo2 is second pull-up resistance. Thus, according to the previous description, both the programmable device 100 and the programmable device 200 have two alternative states, i.e., the first pull-up resistance and the second pull-up resistance also have two alternative states. Hence, the programmable level shifter 3 can be designed to fit in two specific IO circuits with different supply voltage levels.

For example, a programmable level shifter according to the invention may transforms a 1.8-volt voltage level to a 2.5-volt voltage level when the programmable device 100 is programmed, and may also be capable of transforming a 1.8-volt voltage level to a 3.3-volt voltage level when the programmable device 100 is not programmed. Therefore the programmable level shifter can be applied in both a 3.3-volt IO circuit and a 2.5-volt IO circuit to drive specific circuits thereto, thus improving compatibility.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A programmable level shifter, comprising:
   a first P-type field effect transistor (FET) coupled between a first power line and a non-inverted output node and having a gate electrode coupled to an inverted output node;
   a first N-type FET coupled between the non-inverted output node and a second power line and having a gate electrode as a inverted input node;
   a second P-type FET couple between the first power line and the inverted output node and having a gate electrode coupled to the non-inverted output node;
   a second N-type FET coupled between the inverted output node and the second power line and having a gate electrode as a non-inverted input node;
   and a programmable device coupled between the first power line and the non-inverted output node and comprising at least a third P-type FET, wherein the programmable device is capable of being programmed to determine whether the third P-type FET is connected in parallel with the first P-type FET to change an effective resistance between the first power line and the non-inverted output node when the first P-type FET is turned on, and wherein the programmable device receives programming signals externally to the programmable shift register.

2. The programmable level shifter of claim 1, wherein, the programmable device has a switch connected in series with the third P-type FET and between the first power line and the non-inverted output node.

3. The programmable level shifter of claim 2, wherein, the switch is between the third P-type VET and the first power line.

4. The programmable level shifter of claim 2, wherein, the switch is between the third P-type FET and the non-inverted output node.

5. The programmable level shifter of claim 1, the programmable device is a first programmable device, the programmable level shifter further comprises a second programmable device coupled between the first power line and the inverted output node and comprising at least a fourth P-type FET, the second programmable device can be programmed to determine the fourth P-type FET is connected in parallel with the second P-type FET to change an effective resistance between the first power line and the inverted output node when the second P-type FET is turned on.

6. The programmable level shifter of claim 5, wherein, the second programmable device has a switch connected in series with the fourth P-type FET.

7. The programmable level shifter of claim 6, wherein, the switch is between the fourth P-type FET and the first power line.

* * * * *